US009715943B2

United States Patent
Zhu et al.

(10) Patent No.: US 9,715,943 B2
(45) Date of Patent: Jul. 25, 2017

(54) SEMICONDUCTOR MEMORY CELL MULTI-WRITE AVOIDANCE ENCODING APPARATUS, SYSTEMS AND METHODS

(71) Applicant: TEXAS INSTRUMENTS INCORPORATED, Dallas, TX (US)

(72) Inventors: Yuming Zhu, Plano, TX (US); Manish Goel, Plano, TX (US); Clive Bittlestone, Lucas, TX (US); Yunchen Qiu, Plano, TX (US); Sai Zhang, Urbana, IL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 177 days.

(21) Appl. No.: 14/824,935

(22) Filed: Aug. 12, 2015

(65) Prior Publication Data

US 2017/0047130 A1    Feb. 16, 2017

(51) Int. Cl.
| | | |
|---|---|---|
| G11C 29/00 | (2006.01) | |
| G11C 29/38 | (2006.01) | |
| G11C 29/36 | (2006.01) | |
| G11C 16/34 | (2006.01) | |
| G11C 7/10 | (2006.01) | |

(52) U.S. Cl.
CPC ............ *G11C 29/38* (2013.01); *G11C 7/1006* (2013.01); *G11C 16/349* (2013.01); *G11C 29/36* (2013.01); *G11C 2207/2263* (2013.01)

(58) Field of Classification Search
CPC ....... G11C 29/38; G11C 7/1006; G11C 29/36; G11C 2207/2263; G11C 16/349; G06F 3/064; G06F 11/1068
See application file for complete search history.

(56) References Cited

U.S. PATENT DOCUMENTS

| | | | | |
|---|---|---|---|---|
| 9,164,835 B2* | 10/2015 | Lee | ...................... | G06F 11/1068 |
| 2002/0136068 A1* | 9/2002 | Widdershoven | ..... | G11C 16/349 365/200 |
| 2017/0090764 A1* | 3/2017 | Lien | ........................ | G06F 3/064 |

OTHER PUBLICATIONS

Ronald L. Rivest et al., How to Reuse a "Write-Once" Memory; Information and Control 55, 1-19 (1982), Academic Press, Inc., USA.

* cited by examiner

*Primary Examiner* — Christine Tu
(74) *Attorney, Agent, or Firm* — John R. Pessetto; Charles A. Brill; Frank D. Cimino

(57) ABSTRACT

Data words to be written to a memory location are delta encoded in multi-write avoidance ("MWA") code words. MWA code words result in no re-writing of single-bit storage cells containing logical "0's" to a "0" state and no re-writing of logical "1's" to cells that have already been written once to a logical "1." Potential MWA code words stored in a look-up table ("LUT") are indexed by a difference word DELTA_D. DELTA_D represents a bitwise difference ("delta") between a data word currently stored at the memory location and a new data word ("NEW_D") to be stored at the memory location. Validation and selection logic chooses an MWA code word representing NEW_D to be written if the MWA code word does not violate the principle of multi-write avoidance. Some embodiments generate the MWA code words using a pattern generator rather than indexing the MWA code words from a LUT.

20 Claims, 7 Drawing Sheets

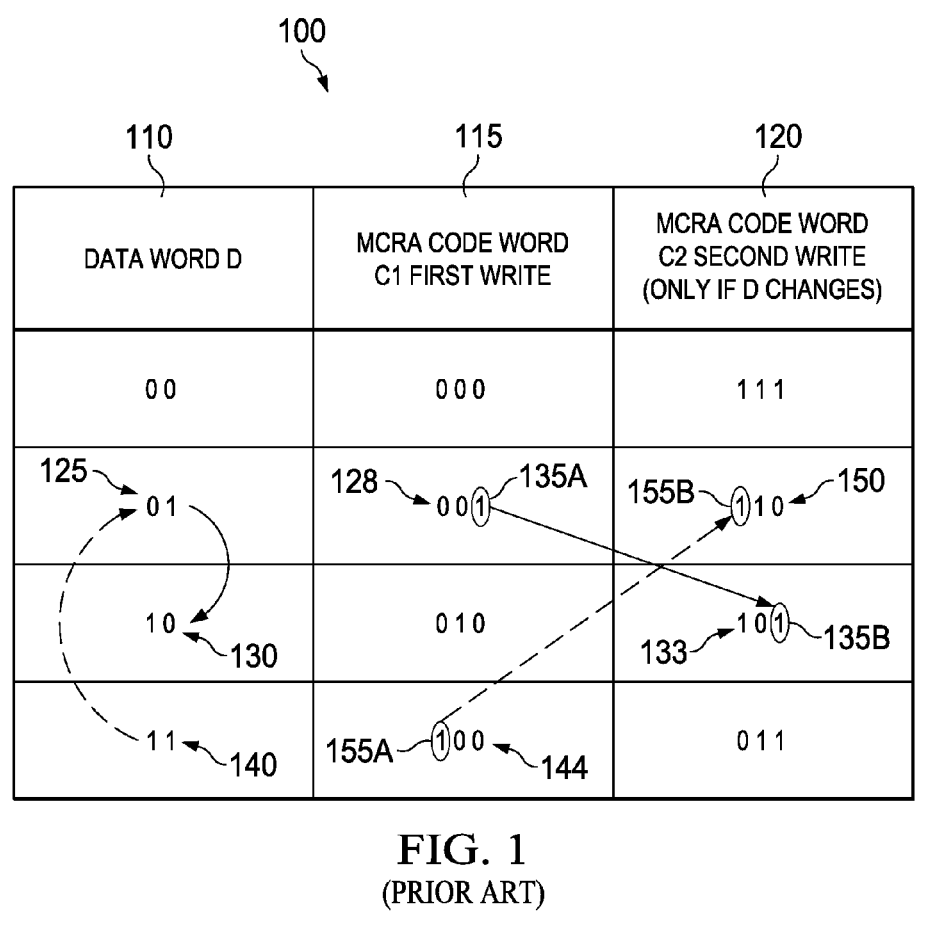

| DATA WORD D | MCRA CODE WORD C1 FIRST WRITE | MCRA CODE WORD C2 SECOND WRITE (ONLY IF D CHANGES) |
|---|---|---|
| 0 0 | 0 0 0 | 1 1 1 |
| 0 1 | 0 0 ①  | ① 1 0 |
| 1 0 | 0 1 0 | 1 0 ① |
| 1 1 | ① 0 0 | 0 1 1 |

FIG. 1
(PRIOR ART)

EXAMPLE: m = 3

| BINARY WEIGHTED VALUE K | BINARY WORD | i = 0 | | i = 1 | | i = 2 | |
|---|---|---|---|---|---|---|---|
| | | B(K,i) | C(K-1) | B(K,i) | C(K-1) | B(K,i) | C(K-1) |
| 0 | 000 | 0 | | 0 | | 0 | |
| 1 | 001 | 1 | C0 | 0 | | 0 | |
| 2 | 010 | 0 | | 1 | C1 | 0 | |
| (3) | 01(1) | (1) | (C2) | (1) | (C2) | 0 | |
| 4 | 100 | 0 | | 0 | | 1 | C3 |
| 5 | 101 | 1 | C4 | 0 | | 1 | C4 |
| 6 | 110 | 0 | | 1 | C5 | 1 | C5 |
| 7 | 111 | 1 | C6 | 1 | C6 | 1 | C6 |

FIG. 5

SEMICONDUCTOR MEMORY CELL MULTI-WRITE AVOIDANCE ENCODING APPARATUS, SYSTEMS AND METHODS

TECHNICAL FIELD

Embodiments described herein relate to semiconductor memory, including structures and methods for data encoding to avoid writing the same memory cell multiple times.

BACKGROUND INFORMATION

Write-once memory ("WOM") and one-time programmable ("OTP") memory are terms used to categorize non-volatile semiconductor memory technologies limited to a single state change of any storage cell. Examples of such technologies include fusible link memories, electrically programmable read-only memory ("EPROM"), and electrically erasable programmable read-only memory ("EEPROM"), among others.

Storage cells of a WOM or OTP semiconductor memory array are typically initialized to the same state, whether all logical 0's or all logical 1's, during manufacturing. It is noted that examples herein assume that memory cells of an array are initialized to all logical 0's during manufacturing. However, some memory devices may be initialized to all logical 1's without any loss of generality in the foregoing disclosure.

Physical limitations associated with a WOM or OTP storage cell either prevent multiple state changes of a cell entirely or render multiple state changes difficult after having been written once following manufacturing. For example, the state of a fusible link memory cannot be changed once the fusible link has been melted with an over-current write signal because there is no way of restoring the fusible link. An EEPROM memory array may be re-programmed only by exposing the floating-gate metal oxide semiconductor field effect transistors (MOSFETs) associated with the storage cells to high-intensity ultraviolet (UV) light. The latter process uses a transparent window to facilitate access to the floating gates and involves an unwieldy erase operation using a UV light source prior to each reprogramming.

Techniques are known for "memory cell reset avoidance" ("MCRA") encoding of data to be written to a WOM or OTP array. MCRA encoding enables multiple data word writes to a target memory location while preventing more than a single state change to any individual storage cell associated with the target memory location. Doing so is important, because writing successive data words to a target memory location would incorrectly write the data to the extent that a successive write attempts to reset one or more bits corresponding to cells of the target memory location. The state of cells already written would not be reset because of the physical limitations described above. A typical MCRA encoding technique may encode an m-bit data word D into an n-bit code word C of bit length $n=(2^m)-1$ bits. The code word C is then written to the target memory location rather than writing D itself. MCRA encoding thus uses additional memory cells to redundantly encode the data, with the trade-off that write-once locations in a memory array may be written to multiple times. MCRA encoding typically enables writing the target memory location $T=1+2^{(m-2)}$ times. It is noted that, for purposes of this entire disclosure, "memory location," "target memory location," and "subset of storage cells" shall mean a set of two or more individual memory cells, each memory cell capable of storing a single code word bit. Thus, a "memory location" or "subset of storage cells" is capable of storing an entire code word.

FIG. 1 is a prior-art example MCRA coding table 100 for a data word D of length m=2. The four possible data words are listed sequentially in column 110 of the table 100. Each D to be stored is encoded in a corresponding C to be written to a memory location. C is selected from column 115 the first time the memory location is written. C is selected from column 120 the second time the memory location is written. However, the memory location is not re-written if D does not change. So, for example, if the first D to be stored is "01" 125, the memory location is written with C1="001" 128. If at a later time a data word D="10" 130 is to be stored at that same memory location, the memory location is re-written with C2="101" 133. Note that the code word change from C1="001" 128 to C2="101" 133 does not attempt to reset any bits of the target memory location from logical "1" to logical "0" as doing so is not possible using the WOM memory types described above. However, it is also noted that the MCRA coding described attempts to write the low-order bit 135A of C1 and 135B of C2 twice, once each during the first and second writes.

Taking another example, if the first D to be stored at a memory location is "11" 140, that memory location is written with C1="100" 144. If at a later time the data word D="01" 125 is to be stored at that same memory location, the memory location is re-written with C2="110" 150. Note that the code word change from C1="100" 144 to C2="110" 150 does not attempt to reset any bits of the target memory location from logical "1" to logical "0" as doing so is not physically possible. However, it is also noted that the MCRA coding described attempts to write the high-order bit 155A of C1 and 155B of C2 twice.

BRIEF DESCRIPTION OF THE DRAWINGS

FIG. 1 is a prior-art example MCRA coding table for a data word D of length m=2.

FIG. 5 is a data table illustrating example intermediate data values in an MCRA decoder associated with a memory cell multi-write avoidance encoding apparatus according to various example methods and embodiments.

SUMMARY OF THE INVENTION

Figure 2:
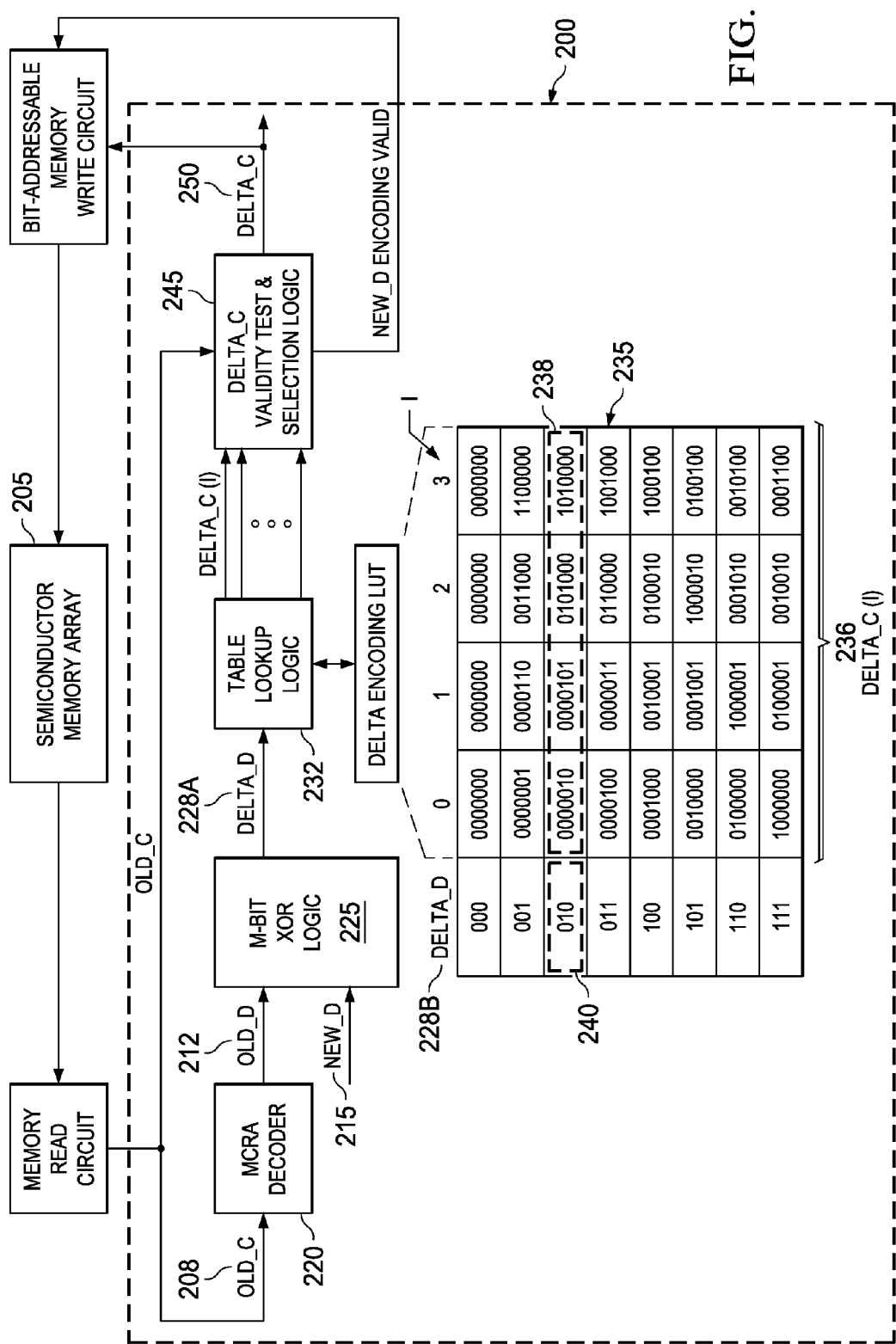
FIG. 2 is a block diagram illustrating a LUT-based semiconductor memory cell multi-write avoidance encoding apparatus according to various example methods and embodiments.

Bit storage cells associated with some semiconductor memory technologies are incapable of a second state change once their as-manufactured state has been changed via a first write operation. For other technologies such as EEPROM, erasing and re-writing is possible but tedious. The problem of resetting once-programmed cells of a target memory location may be avoided with the use of MCRA encoding as previously described. However, MCRA encoding operations may attempt to re-write logical "1's" to previously-written cells as described above in examples associated with the MCRA encoding table of FIG. 1. Doing so may cause bit line disturbances and noise-related problems as the corresponding storage cell locations are not actually re-written during the write operation but rather remain in their previous set state. Storage cells implemented with other memory types such as flash memory may be capable of multiple state changes. However, the cells may become progressively weaker with each state change. Thus, it may be desirable to encode data to be written to such memory types using a "multi-write avoidance" ("MWA") code, also referred to herein as semiconductor memory "delta encoding."

Structures and methods described herein encode successive data words to be written to a given memory location in MWA code words that do not re-write single-bit storage cells that have already been written once to a logical "1". Neither do embodiments re-write cells containing logical "0's" to a "0" state. "Delta encoding" refers to the characteristic that the only cells of the target memory location written to are those for which the new code word requires a state change from a logical "0" to a logical "1" (the "delta"). Thus, the entire new code word is not written, only the delta.

Various embodiments of the MWA encoder are disclosed herein. A first embodiment stores the MWA code words in a look-up table ("LUT"). A bitwise difference is determined between the existing data word ("OLD_D") associated with a memory location to be re-written and a new data word ("NEW_D") to be associated with that memory location. The bitwise difference is used to index several potential MWA code words corresponding to NEW_D from the LUT. From the several potential MWA code words, validation and selection logic chooses one which does not violate the principle of memory cell multi-write avoidance, also referred to here as the "MWA requirement." The delta bits of the chosen MWA code word are then written to the memory location.

A second embodiment of the MWA encoder generates m-bit data words and transforms each generated m-bit data word into a potential MWA code word rather than looking up the MWA code words from a LUT. The m-bit pattern generator produces intermediate data words. The intermediate data words are combined with NEW_D and are binary weight encoded to generate potential MWA code words. As each potential MWA code word is generated, it is checked by validation logic to determine whether it meets the MWA requirement. If so, the corresponding DELTA_C bits are written to the target memory location. In the case of an MWA violation, another potential MWA code word is generated from the next m-bit pattern from the pattern generator and is validated. The process continues until a valid MWA code word is found. The DELTA_C bits from the MWA code word are then written to the target memory location.

Like the second embodiment, a third embodiment of the MWA encoder generates potential MWA code words. However, a pattern generator of the third embodiments operates in the code word domain without NEW_D input. Consequently, the third embodiment validates the potential MWA code words generated both for MWA validity and for correspondence to the desired NEW_D. A potential MWA code word generated by the code word pattern generator is validity tested for MWA compliance by first validity test logic as previously described for the first and second embodiments. If the potential MWA code word is invalid, a different potential MWA code word is requested from the code word pattern generator. If valid, the potential MWA code word is decoded to generate a trial new data word ("NEW_D_TRIAL"). NEW_D_TRIAL is compared to the desired NEW_D. If NEW_D_TRIAL matches NEW_D, a validity signal allows the DELTA_C bits from the MWA code word to be written to the target memory location. If NEW_D_TRIAL does not match NEW_D, a different potential MWA code word is requested from the code word pattern generator.

DETAILED DESCRIPTION

FIG. 2 is a block diagram illustrating a LUT-based semiconductor memory cell MWA encoding apparatus 200 according to various example methods and embodiments. The apparatus 200 interfaces to a semiconductor memory array 205. The memory array 205 includes a subset of storage cells from which to read an existing ($2^m-1$) bit MWA code word ("OLD_C") 208. OLD_C 208 represents an existing m-bit data word ("OLD_D") 212. The encoding apparatus 200 creates bit changes to OLD_C 208 to create a new MWA code word ("NEW_C"). NEW_C encodes a new data word ("NEW_D") 215 for storage in the memory array 205. OLD_D 212 and NEW_D 215 are m bits wide. OLD_C 208 and NEW_C are ($2^m-1$) bits wide.

The MWA encoding apparatus 200 includes a memory cell reset avoidance ("MCRA") decoder 220. The MCRA decoder 220 receives a code word from a memory (e.g., OLD_C 208 in the case of the MWA encoding apparatus 200). The MCRA decoder 220 decodes the code word in order to discover the corresponding data word (e.g., OLD_D 212 decoded from OLD_C 208).

Figure 3:
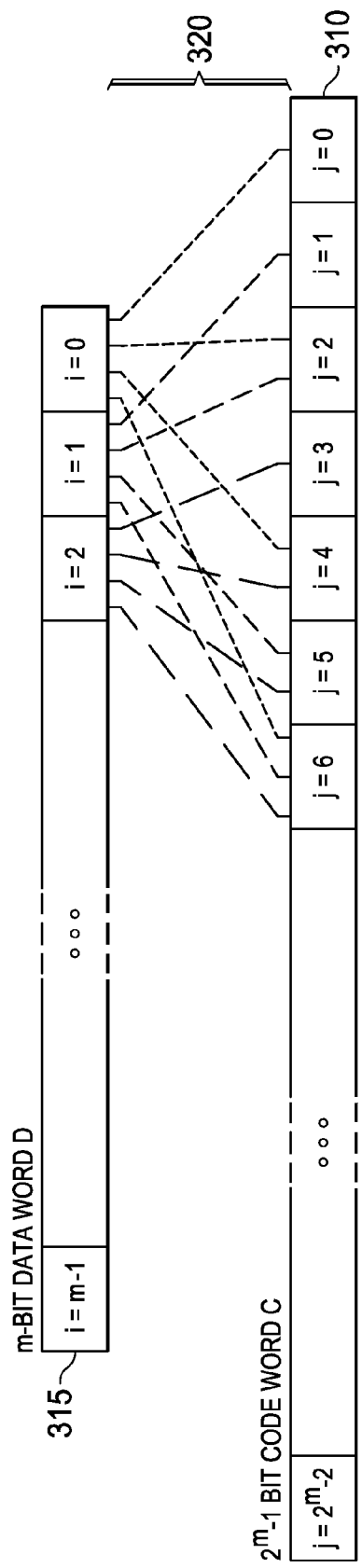
FIG. 3 is a diagram illustrating data word and code word bit fields in an MCRA decoder associated with a memory cell multi-write avoidance encoding apparatus according to various example methods and embodiments.

FIG. 3 is a diagram illustrating bit fields in a ($2^m-1$) bit long binary code word C 310 processed by the MCRA decoder 220. The low order to high order bit positions of C are denominated j=0 through j=($2^m-2$). FIG. 3 also illustrates bit fields in a data word D 315 resulting from the decoding of C. D is an m-bit binary data word with low order to high order bit positions denominated i=0 to i=m−1. Each bit D(i) is recovered by performing an exclusive OR ("XOR") operation on a subset of code word bits Ca). Dashed lines 320 show which code word bits C(j) are XOR'd to recover each data word bit D(i) for an m=3 example case.

For example, D(0)=C(0) XOR C(2) XOR C(4) XOR C(6). The following equivalent form of the immediately previous equation will be used hereinafter for similar XOR equations in the interest of brevity and clarity: D(0)=XOR[C(0), C(2), C(4), C(6)]. D(1)=XOR[C(1), C(2), C(5), C(6)]. D(2)=XOR[C(3), C(4), C(5), C(6)].

In general, the MCRA decoder performs the following operation on C to recreate D:

$$D(i) = \bigwedge_{j=1}^{2^m-1} B(j, i) \cdot C(j-1)$$

The MCRA decoder may be implemented with combinational logic and may determine D(i) in parallel for each i. Some embodiments of the MCRA decoder may determine D(i) iteratively for each i as further described below. The example MCRA decoder structure and operation described below clarify the process for choosing which code bits C(j) are XOR'd to decode a particular data bit D(i). It is noted that XOR operations described throughout this disclosure may be replaced with modulo-2 sum operations without loss of generality.

Figure 4:
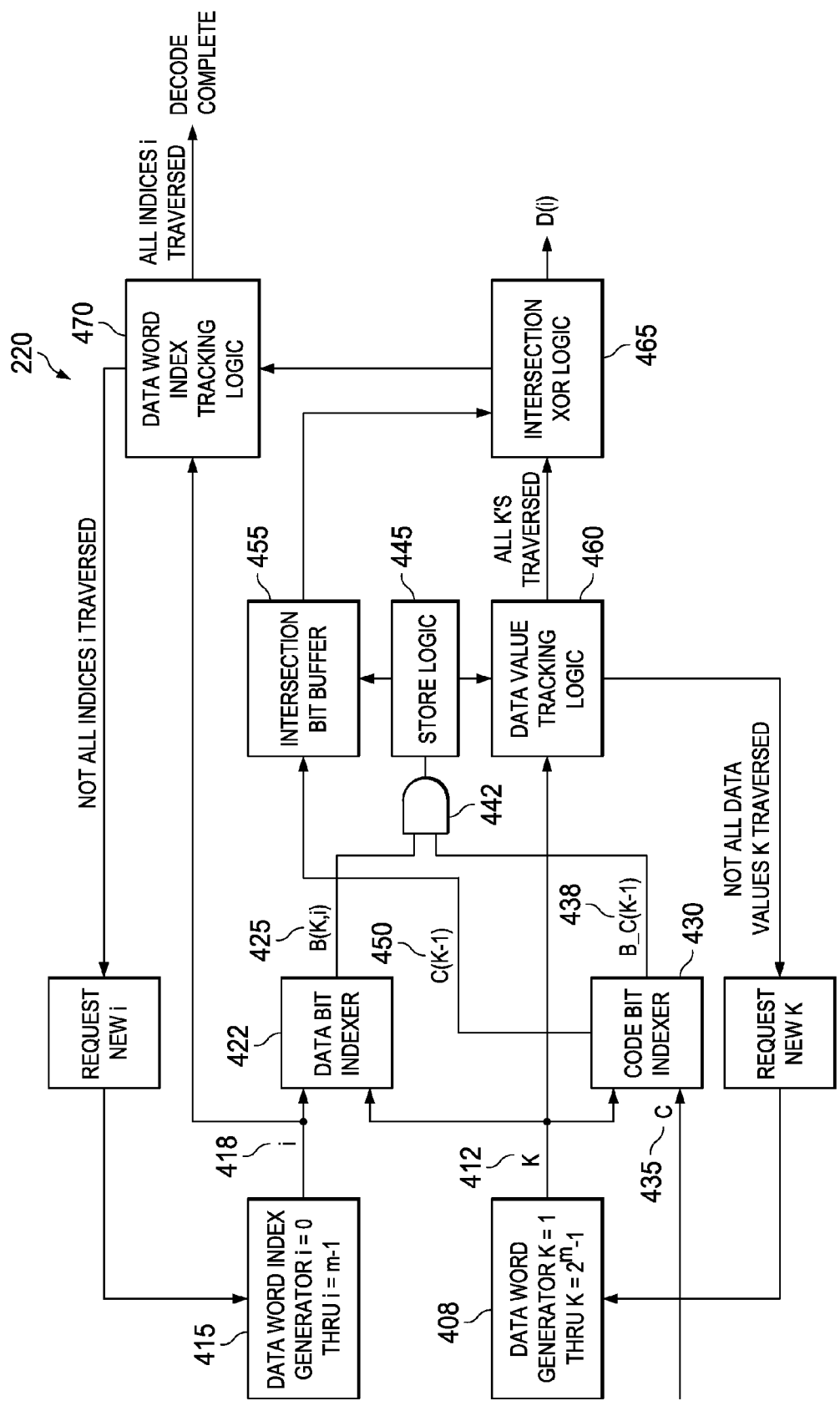
FIG. 4 is a block diagram illustrating an MCRA decoder associated with a memory cell multi-write avoidance encoding apparatus according to various example methods and embodiments.

FIG. 4 is a block diagram illustrating an MCRA decoder 220 associated with a memory cell MWA encoding apparatus according to various example methods and embodiments. It is noted that the MCRA decoder 220 is described here in conjunction with the description of the LUT-based MWA encoding apparatus 200. It is also noted that the decoder 220 is used in other embodiments of MWA encoding apparatus described further below.

The MCRA decoder 220 includes a data word generator 408. The data word generator 408 generates a series of m-bit binary data words D. Each data word D generated by the data word generator 408 represents a binary weighted integer value K. The data word generator 408 generates all possible binary data words D of bit length m representing K=1 through K=(2^m−1). Some embodiments of the generator may generate D=(all 0's) corresponding to K=0; however K=0 is not used by the decoder 220.

FIG. 5 is a data table illustrating intermediate data values generated within the MCRA decoder 220 for the example case of m=3. Binary words 510 are generated by the data word generator 408. Each binary word 510 generated represents a corresponding binary weighted integer value K 515. It is noted that the data word generator 408 need not generate the binary words 510 sequentially, as long as all possible binary words representing K=1 through K=(2^m−1) are generated.

Turning back now to FIG. 4, the MCRA decoder 220 also includes a data word index generator 415. The data word index generator 415 generates a series of data word bit position indices i 418 from i=0 through i=m−1.

The MCRA decoder 220 also includes a data bit indexer 422 coupled to the data word index generator 415 and to the data word generator 408. The data bit indexer 422 receives a current value of the index i 418 from the data word index generator 415 and a current value of the data word K 412 from the data word generator 408. The data bit indexer outputs a state of the $i^{th}$ bit of the current data word representing K 412, denominated B(K,i) 425. Turning briefly to FIG. 5 for an example 515, K=3. For i=0, the $0^{th}$ bit of the binary word (011) corresponding to K=3 is set. Thus, B(3,0)=1 for the example 515. For i=1, the $1^{st}$ bit of the binary word (011) corresponding to K=3 is set. Thus, B(3,1)=1 for the example 515. For i=2, the $2^{nd}$ bit of the binary word (011) corresponding to K=3 is reset. Thus, B(3,2)=0 for the example 515.

Turning back to FIG. 4, the MCRA decoder 220 also includes a code bit indexer 430. The code bit indexer 430 is coupled to the data word generator 408 to receive the current K 412 and is coupled to a decoder input terminal to receive a code word C 435 to be decoded. The code bit indexer finds and determines the state of the $(K-1)^{th}$ bit of C 435 and outputs the indexed code bit state as B_C(K−1) 438.

The MCRA decoder 220 also includes AND logic 442 coupled to the data bit indexer 422 and to the code bit indexer 430. The AND logic 442 determines, for each K and each i, whether bits B(K,i) and B_C(K−1) are both set. If so, store logic 445 initiates the storage of the code bit index C(K−1) 450 in an intersection bit buffer 455 coupled to the code bit indexer 430. C(K−1)=C2 is stored for the example 515 of FIG. 5.

The MCRA decoder 220 also includes data value tracking logic 460 coupled to the data word generator 408. The data value tracking logic 460 determines whether all possible data words have been generated while i 418 is set to a current value. If not, the data value tracking logic 460 initiates a request to the data word generator 408 for a next K. If, on the other hand, all possible data words have been generated while i 418 is set to a current value, the data value tracking logic initiates an XOR operation to be performed on all code word bits flagged as logical "1's" and stored in the intersection bit buffer 455. The XOR operation is performed by intersection XOR logic 465 communicatively coupled to the data bit indexer 422 and to the code bit indexer 430. The intersection XOR logic performs, for each i, an XOR operation on all bits for which B(K,i) and C(K−1) are both logical "1" in order to generate a corresponding bit D(i) of a decoded data word D. Turning again now to FIG. 5, example 520 shows that the set of code word bit positions to include in the XOR operation to recover the D(i=0) data bit are {C0, C2, C4, C6}.

Turning back to FIG. 4, the MCRA decoder 220 also includes data word index tracking logic 470 coupled to the data word index generator 415. The data word index tracking logic 470 determines whether all values of i have been generated following each XOR operation. If not, the data word index tracking logic 470 initiates a request to the data word index generator 415 to generate a next i. If, on the other hand, all values of i have been generated, the data word index tracking logic 470 terminates decoding as C 435 has been completely decoded. It is noted that values of K and i need not be iterated sequentially or in any particular order. It is also noted that some embodiments of the MCRA decoder 220 may traverse multiple values of the data word index i for each value of K before moving to a different K or may traverse multiple values of K for each i before moving to a different i, or may do so in any order.

Returning now to FIG. 2, the LUT-based semiconductor memory cell MWA encoding apparatus 200 includes m-bit wide XOR logic 225 coupled to the MCRA decoder 220. XOR logic 225 receives OLD_D 212 and a desired NEW_D 215 to store and performs a bitwise XOR operation on OLD_D 212 and NEW_D 215 in order to create an m-bit wide binary word DELTA_D 228A and 228B. DELTA_D 228A, 228B represents bit state differences between OLD_D 212 and NEW_D 215.

The MWA encoding apparatus 200 also includes table lookup logic 232 coupled to the XOR logic 225. The table lookup logic 232 receives DELTA_D 228A and indexes a set of potential MWA code words DELTA_C(I) from a two-dimensional delta encoding LUT 235 coupled to the table lookup logic 232.

During operation, the LUT 235 is indexed by the table lookup logic 232 using DELTA_D 228A and 228B. The delta encoding LUT 235 stores a set of 2^(m−1) potential difference code words DELTA_C(I) 236 associated with each DELTA_D. Each set of difference code words DELTA_C(i) 236 (e.g., the set 238) corresponds to a possible DELTA_D 228B (e.g., the DELTA_D 240). Each set bit of each DELTA_C(I) 236 represents a state change at a corresponding bit position between OLD_C 208 and a NEW_C. NEW_C represents NEW_D 215.

One or more of the difference code words DELTA_C(I) 236 may satisfy the MWA requirement of having no bits set at bit positions for which bits are set in OLD_C 208. If the latter condition is not met by any DELTA_C(I) corresponding to the current DELTA_D (e.g., any of the four DELTA_C (I) 238 corresponding to the DELTA_D 240 of 010), the attempted encoding of NEW_D 215 fails. Such failure is an indication that all cells of the addressed set of storage cells necessary to encode NEW_D 215 have previously been written. In the latter case, it is up to supervisory logic external to the MWA encoding apparatus 200 to decide what to do. In the case of WOM-type storage cells, for example, NEW_D as encoded by the encoder 200 cannot be written. Attempting to do so would attempt to change the state of one or more single-write storage cells which have already been written.

It is noted that entries in the LUT 235 may be determined at a time earlier than the time of using the MWA encoding apparatus 200 for encoding operations. LUT entries may be created by generating all bit combinations of a $(2^m-1)$ bit word with at most two bits set to create LUT DELTA_C(I) values 236. Each such LUT DELTA_C(I) value may then be decoded using an MCRA decoder such as the decoder 220 described above. The MCRA decoder determines a LUT DELTA_D value corresponding to the LUT DELTA_C(I) value at the decoder input. The DELTA_C(I) value is then associated in the LUT with the DELTA_D value appearing at the output of the decoder. (E.g., using the LUT visualization shown on FIG. 2, DELTA_C(I) values decoding to a particular DELTA_D are inserted in the LUT row associated with that DELTA_D.)

The encoder 200 also includes DELTA_C validity test and selection logic 245 communicatively coupled to the delta encoding LUT 235. The DELTA_C validity test and selection logic 245 determines which, if any, of the DELTA_C(I) corresponding to the current DELTA_D meet the MWA requirement as described above. An AND logic portion of the DELTA_C validity test and selection logic 245 (not shown in FIG. 2) receives OLD_C 208 and each of the DELTA_C(I) words. The AND logic portion tests each of the DELTA_C(I) words by confirming that a bitwise compare of OLD_C 208 to a DELTA_C(I) results in all logical "0"s.

If so, the DELTA_C validity test and selection logic 245 enables an update of OLD_C 208 in the set of storage cells by a selected one of DELTA_C(I) corresponding to the current DELTA_D and meeting the MWA requirement. The selected DELTA_C(I) is denominated "DELTA_C" 250. It is noted that only set bits of DELTA_C 250 need be written to the subset of memory array storage cells to write NEW_C. Said differently, an encoded NEW_D 215 may be stored in the same memory location as the encoded OLD_D 212 by replacing OLD_C 208 with NEW_C. And OLD_C 208 may be replaced with NEW_C by changing the state of only those storage cells corresponding to the one or two set bits of DELTA_C 250.

Figure 6:
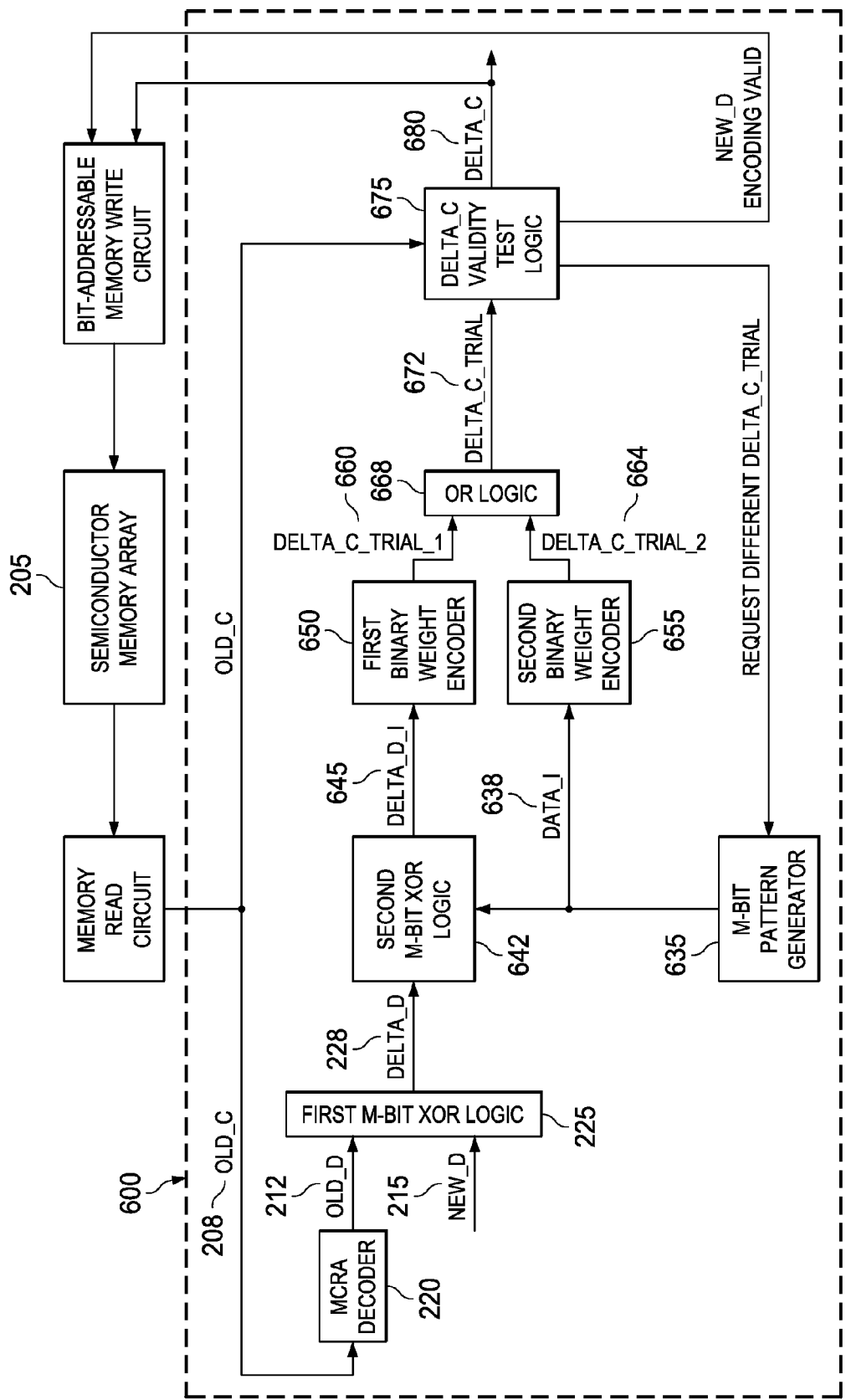
FIG. 6 is a block diagram illustrating a pattern generator-based semiconductor memory cell multi-write avoidance encoding apparatus according to various example methods and embodiments.

FIG. 6 is a block diagram illustrating a pattern generator-based semiconductor memory cell MWA encoding apparatus 600 according to various example methods and embodiments. The MWA encoding apparatus 600 includes an MCRA decoder 220 as illustrated with FIGS. 3, 4 and 5 and as described above with reference to the encoding apparatus 200 of FIG. 2. The MCRA decoder 220 receives an existing $(2^m)-1$ bit wide MWA code word OLD_C 208 from a subset of storage cells in a semiconductor memory array 205. OLD_C 208 represents an existing m-bit data word OLD_D 212. The MCRA decoder 220 decodes OLD_C 208 to determine OLD_D 212.

The MWA encoding apparatus 600 also includes first m-bit wide XOR logic 225 coupled to the MCRA decoder 220. The XOR logic 225 receives OLD_D 208 and a NEW_D 215 to be written. The XOR logic 225 performs a bitwise XOR operation on OLD_D 212 and NEW_D 215 in order to create a DELTA_D 228.

The encoding apparatus 600 further includes an m-bit pattern generator 635 communicatively coupled to the first m-bit wide XOR logic 225. The pattern generator 635 generates an m-bit intermediate data word ("DATA_I") 638. It is noted that DATA_I 638 need not be generated sequentially or in any particular order.

The encoding apparatus 600 also includes second m-bit XOR logic 642 coupled to the first m-bit XOR logic 225 and to the m-bit pattern generator 635. The second m-bit XOR logic 642 receives DELTA_D 228 and DATA_I 638 and performs a bitwise XOR operation on DELTA_D 228 and DATA_I 638. Doing so creates an m-bit intermediate data difference word ("DELTA_D_I") 645.

The encoding apparatus 600 further includes first and second binary weight encoders 650 and 655, respectively. The first binary weight encoder 650 transforms DELTA_D_I 645 to a first $(2^m)-1$ bit trial code word component DELTA_C_TRIAL_1 660. DELTA_C_TRIAL_1 660 has a single bit set at a bit position corresponding to the integer value of DELTA_D_I 645. For example, a DELTA_D_I 645 of "110" has an integer value of 6. DELTA_C_TRIAL_1 660 is "0100000", with the sixth bit from the right set to logical "1". Likewise, the second binary weight encoder 655 transforms DATA_I 638 to a second $(2^m)-1$ bit trial code word component DELTA_C_TRIAL_2 664. DELTA_C_TRIAL_2 664 has a single bit set at a bit position corresponding to the integer value of DATA_I.

The encoding apparatus 600 also includes OR logic 668 coupled to the first and second binary weight encoders 650 and 655. The OR logic 668 performs a bitwise OR operation on DELTA_C_TRIAL_1 660 and DELTA_C_TRIAL_2 664 in order to combine DELTA_C_TRIAL_1 660 and DELTA_C_TRIAL_2 664 into a trial difference code word DELTA_C_TRIAL 672. DATA_I 638 is thus combined with DELTA_D 228 and encoded to form DELTA_C_TRIAL 672. Each set bit of DELTA_C_TRIAL 672 represents a state change at a corresponding bit position between OLD_C 208 and the new code word NEW_C.

The MWA encoding apparatus 600 includes DELTA_C validity test logic 675 communicatively coupled to the m-bit pattern generator 635. The DELTA_C validity test logic 675 determines if DELTA_C_TRIAL 672 satisfies an MWA requirement of having no bits set at bit positions for which bits are set in OLD_C. The DELTA_C validity test logic 675 performs a bitwise compare of OLD_C 208 to DELTA_C_TRIAL 672 and confirms that the compare results in all logical "0"s. If so, the DELTA_C validity test logic 675 enables an update of OLD_C 208 in the set of storage cells by a DELTA_C_TRIAL 672 denominated "DELTA_C" 680. If the DELTA_C validity test logic 675 determines that DELTA_C_TRIAL 672 doe not satisfy the MWA requirement, a different DATA_I 638 is requested of the pattern generator 635 in order to generate a different DELTA_C_TRIAL 672. The MWA encoding apparatus 600 thus generates trials in the data word domain to find a new code word meeting the MWA requirement.

Figure 7:
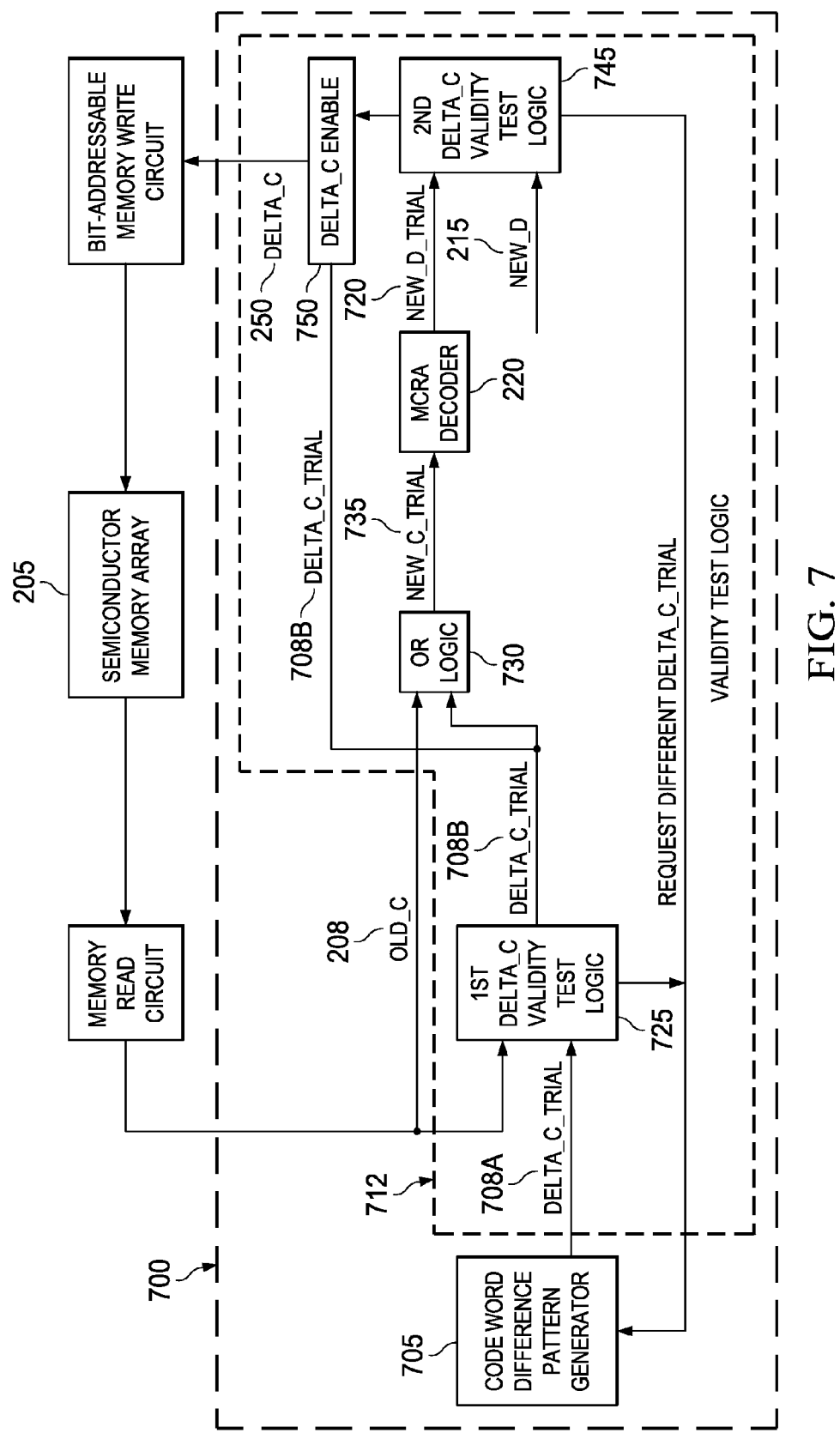
FIG. 7 is a block diagram illustrating a pattern generator-based semiconductor memory cell multi-write avoidance encoding apparatus according to various example methods and embodiments.

FIG. 7 is a block diagram illustrating a pattern generator-based semiconductor memory cell MWA encoding apparatus 700 according to various example methods and embodiments. The MWA encoding apparatus 700 generates trials in the code word domain to find a new code word meeting the MWA requirement and appropriate to the new data word NEW_D to be stored.

The MWA encoding apparatus 700 includes a code word difference pattern generator 705. The code word difference pattern generator 705 generates a trial difference code word DELTA_C_TRIAL 708A. Each set bit of DELTA_C_TRIAL 708A represents a state change at a corresponding bit position between an existing $(2^m)-1$ bit wide MWA code word OLD_C 208 currently stored in a subset of storage cells in a semiconductor memory array 205 and a new code word NEW_C to replace OLD_C 208. OLD_C represents an existing m-bit data word OLD_D; and NEW_C represents a new data word NEW_D 215 to be stored. It is noted that DELTA_C_TRIAL 708A need not be generated sequentially or in any particular order.

The encoding apparatus 700 also includes validity test logic 712 coupled to the code word difference pattern generator 705. The validity test logic 712 determines whether DELTA_C_TRIAL 708A satisfies a first condition of having no bits set at bit positions for which bits are set in OLD_C 208. The validity test logic 712 also determines whether DELTA_C_TRIAL 708A satisfies a second condition of being decodable to a new trial data word ("NEW_D_TRIAL") 720 corresponding to NEW_D 215. The validity test logic 712 also enables an update to OLD_C 208 by a DELTA_C 250 equal to DELTA_C_TRIAL 708B if both the first and second conditions are satisfied.

The validity test logic 712 includes first DELTA_C validity test logic 725 coupled to the code word difference pattern generator 705. The first DELTA_C validity test logic 725 receives DELTA_C_TRIAL 708A and OLD_C 208. The first DELTA_C validity test logic 725 performs a bitwise compare operation on DELTA_C_TRIAL 708A and on OLD_C 208. The first DELTA_C validity test logic 725 requests a different DELTA_C_TRIAL 708A from the pattern generator if a bit at any bit position is set in both DELTA_C_TRIAL 708A and in OLD_C 208.

The validity test logic 712 of the MWA encoding apparatus 700 also includes OR logic 730 coupled to the first DELTA_C validity test logic 725. The OR logic 730 receives DELTA_C_TRIAL 708B and OLD_C 208 and combines DELTA_C_TRIAL 708B and OLD_C 208 via a bitwise logical OR operation. A trial code word NEW_C_TRIAL 735 results from the combination.

The validity test logic 712 of the MWA encoding apparatus 700 further includes a MCRA decoder 220 coupled to the OR logic 730. The MCRA decoder 220 receives and decodes NEW_C_TRIAL 735, resulting in NEW_D_TRIAL 720 as previously mentioned in the context of the overview description of the validity test logic 712.

The validity test logic 712 of the MWA encoding apparatus 700 includes second DELTA_C validity test logic 745 coupled to the MCRA decoder 220. The second DELTA_C validity test logic 745 receives NEW_D_TRIAL 720 and NEW_D 215 and performs a bitwise compare operation on NEW_D_TRIAL 720 and NEW_D 215. The second DELTA_C validity test logic 745 requests a different DELTA_C_TRIAL 708A from the pattern generator if NEW_D_TRIAL 720 is not equal to NEW_D 215.

The state of NEW_D_TRIAL 720 not being equal to NEW_D 215 is an indication that, although DELTA_C_TRIAL 708B meets the MWA validity requirement by not having bits set in the same position as set bits in OLD_C 208 as determined by the first DELTA_C validity test logic 725, DELTA_C_TRIAL 708B simply does not correspond to the new data word to be stored, NEW_D 215.

The validity test logic 712 of the MWA encoding apparatus 700 also includes DELTA_C enable logic 750 coupled to the second DELTA_C validity test logic 745. The DELTA_C enable logic 750 receives an indication from the second DELTA_C validity test logic 745 when NEW_D_TRIAL 720 is equal to NEW_D 215 and in that case enables DELTA_C 250 to be written to the subset of storage cells in the memory array 205.

Apparatus and methods described herein may be useful in applications other than encoding data words to be written to a memory array. The examples of the apparatus 200, 400, 600 and 700 described herein are intended to provide a general understanding of the structures of various embodiments. They are not intended to serve as complete descriptions of all elements and features of apparatus, systems and methods that might make use of these example structures and sequences.

Embodiments and methods described herein encode data words to be written to a semiconductor memory array in such a way as to avoid attempted re-writes of memory storage cells already written. Doing so may reduce instabilities caused by over-driving or over-charging storage cell elements of WOM storage technologies and/or may increase overall total lifetime write operations of re-writable memory types by reducing bulk/block erases and re-writes. Higher device reliabilities and lower costs may result.

By way of illustration and not of limitation, the accompanying figures show specific embodiments in which the subject matter may be practiced. It is noted that arrows at one or both ends of connecting lines are intended to show the general direction of electrical current flow, data flow, logic flow, etc. Connector line arrows are not intended to limit such flows to a particular direction such as to preclude any flow in an opposite direction. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Accordingly, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. The following claims are hereby incorporated into the Detailed Description, with each claim standing on its own as a separate embodiment.

What is claimed is:

1. A semiconductor memory cell multi-write avoidance (MWA) encoding apparatus, comprising:
   a memory cell reset avoidance (MCRA) decoder to receive an existing ($2^m$)−1 bit wide MWA code word (OLD_C) from a subset of storage cells in a semiconductor memory array, OLD_C representing an existing m-bit data word (OLD_D), the MCRA decoder to decode OLD_C to determine OLD_D;

a two-dimensional delta encoding look-up table (LUT) communicatively coupled to the MCRA decoder to be indexed by a DELTA_D, the DELTA_D being an m-bit word, each set bit of the DELTA_D representing a state change at a corresponding bit position between the OLD_D and a NEW_D to be encoded as a NEW_C and stored in the subset of storage cells in the semiconductor storage array, the delta encoding LUT to store a plurality of potential difference code words DELTA_C (I) corresponding to each possible DELTA_D, each set bit of each DELTA_C(I) representing a state change at a corresponding bit position between the OLD_C and the NEW_C, at least one of the plurality of difference code words DELTA_C(I) to satisfy an MWA requirement of having no bits set at bit positions for which bits are set in the OLD_C; and DELTA_C validity test and selection logic communicatively coupled to the delta encoding LUT to determine which, if any, of the DELTA_C(I) meet the MWA requirement and to enable an update of OLD_C in the set of storage cells by a selected one of the DELTA_C (I) meeting the MWA requirement and denominated "DELTA_C".

2. The semiconductor memory cell MWA encoding apparatus of claim 1, further comprising:

an AND logic portion of the DELTA_C validity test and selection logic to receive the OLD_C and each of the DELTA_C(I) words and to test each of the DELTA_C (I) words by confirming that a bitwise compare of the OLD_C to each DELTA_C(I) results in all logical "0's".

3. The semiconductor memory cell MWA encoding apparatus of claim 2, the MCRA decoder further comprising:

a data word generator to generate a series of m-bit data words D, each data word having a binary weighted value K, from K=1 through K=2^m−1;

a data word index generator to generate a series of data word bit position indices i from i=0 through i=m−1;

a data bit indexer coupled to the data word index generator and to the data word generator to receive a current value of the index i from the data word index generator and to receive a current value of the data word K from the data word generator and to output a state of the $i^{th}$ bit of the current K, B(K,i);

a code bit indexer coupled to the data word generator to receive the current K and coupled to a decoder input terminal to receive a code word C to be decoded, the code bit indexer to output a state of the $(K-1)^{th}$ bit of C, C(K−1); and intersection XOR logic communicatively coupled to the data bit indexer and to the code bit indexer to perform, for each i, an XOR operation on all bits for which B(K,i) and C(K−1) are both logical "1" in order to generate a corresponding bit D(i) of a decoded data word D.

4. The semiconductor memory cell MWA encoding apparatus of claim 3, the MCRA decoder further comprising:

AND logic coupled to the data bit indexer and to the code bit indexer to determine, for each K and each i, whether bits B(K,i) and C(K−1) are both set;

an intersection bit buffer coupled to the code bit indexer to store (K−1) for each K of a current i if bits B(K,i) and C(K−1) are both set; and store logic coupled to the AND logic to trigger a store operation.

5. The semiconductor memory cell MWA encoding apparatus of claim 3, the MCRA decoder further comprising:

data value tracking logic coupled to the data word generator to determine whether all possible data words have been generated while i is set to a current value, to request a next K if all possible data words have not been generated for a current value of i, and to initiate the XOR operation if all possible data words have been generated while i is set to the current value; and data word index tracking logic coupled to the data word index generator to determine whether all values of i have been generated following an XOR operation, to request a next i if all values of i have not been generated, and to terminate decoding if all value of i have been generated.

6. The semiconductor memory cell MWA encoding apparatus of claim 2, entries in the delta encoding LUT determined by generating all bit combinations of a (2^m−1) bit word with at most two bits set to create LUT DELTA_C(I) values, decoding each LUT DELTA_C(I) value using an off-line MCRA decoder at a time prior to encoding to determine a LUT DELTA_D value corresponding to each LUT DELTA_C(I) value, and associating the LUT DELTA_D values and the corresponding LUT DELTA_C(I) values in the LUT.

7. The semiconductor memory cell MWA encoding apparatus of claim 6, further comprising:

table lookup logic coupled to the XOR logic to receive the DELTA_D and to index the plurality of potential MWA code words DELTA_C(I) from the table using the DELTA_D.

8. The semiconductor memory cell MWA encoding apparatus of claim 2, further comprising:

m-bit wide exclusive OR (XOR) logic coupled to the MCRA decoder to receive the OLD_D and the NEW_D and to perform a bitwise XOR operation on the OLD_D and the NEW_D in order to create the DELTA_D.

9. A semiconductor memory cell multi-write avoidance ("MWA") encoding apparatus, comprising:

a memory cell reset avoidance (MCRA) decoder to receive an existing (2^m)−1 bit wide MWA code word (OLD_C) from a subset of storage cells in a semiconductor memory array, OLD_C representing an existing m-bit data word (OLD_D), the MCRA decoder to decode OLD_C to determine OLD_D an m-bit pattern generator communicatively coupled to the MCRA decoder to generate an intermediate data word (DATA_I), DATA_I to be combined with a data difference word DELTA_D and encoded to form a trial difference code word (DELTA_C_TRIAL), the DELTA_D being an m-bit word, each set bit of the DELTA_D representing a state change at a corresponding bit position between the OLD_D and a NEW_D to be encoded as a NEW_C and stored in the subset of storage cells in the semiconductor array, each set bit of the DELTA_C_TRIAL representing a state change at a corresponding bit position between the OLD_C and the NEW_C; and DELTA_C validity test logic communicatively coupled to the m-bit pattern generator to determine if the DELTA_C_TRIAL satisfies an MWA requirement of having no bits set at bit positions for which bits are set in the OLD_C by performing a logical AND operation on the OLD_C and on the DELTA_C_TRIAL, to enable an update of OLD_C in the set of storage cells by the DELTA_C_TRIAL denominated DELTA_C if the DELTA_C_TRIAL meets the MWA requirement, and to request a different DATA_I of the m-bit pattern generator in order to generate a different DELTA_C_TRIAL if the DELTA_C_TRIAL does not meet the MWA requirement.

10. The semiconductor memory cell MWA encoding apparatus of claim 9, further comprising:
    first m-bit wide exclusive OR (XOR) logic coupled to the MCRA decoder to receive the OLD_D and the NEW_D and to perform a bitwise XOR operation on the OLD_D and the NEW_D in order to create the DELTA_D.

11. The semiconductor memory cell MWA encoding apparatus of claim 10, further comprising:
    second m-bit XOR logic coupled to the first m-bit XOR logic and to the m-bit pattern generator to receive the DELTA_D and the DATA_I and to perform a bitwise XOR operation on the DELTA_D and the DATA_I in order to create an intermediate data difference word (DELTA_D_I).

12. The semiconductor memory cell MWA encoding apparatus of claim 11, further comprising:
    a first binary weight encoder to transform the m-bit DELTA_D_I to a first (2^m)−1 bit trial code word component DELTA_C_TRIAL_1, the DELTA_C_TRIAL_1 having a single bit set at a bit position corresponding to an integer value of the DELTA_D_I.

13. The semiconductor memory cell MWA encoding apparatus of claim 12, further comprising:
    a second binary weight encoder to transform the m-bit DATA_I to a second (2^m)−1 bit trial code word component DELTA_C_TRIAL_2, the DELTA_C_TRIAL_2 having a single bit set at a bit position corresponding to an integer value of the DATA_I.

14. The semiconductor memory cell MWA encoding apparatus of claim 13, further comprising:
    OR logic coupled to the first and second binary weight encoders to perform a bitwise OR operation on the DELTA_C_TRIAL_1 and the DELTA_C_TRIAL_2 in order to combine the DELTA_C_TRIAL_1 and the DELTA_C_TRIAL_2 to form the DELTA_C_TRIAL.

15. A semiconductor memory cell multi-write avoidance (MWA) encoding apparatus, comprising:
    a code word difference pattern generator to generate a trial difference code word DELTA_C_TRIAL, each set bit of the DELTA_C_TRIAL representing a state change at a corresponding bit position between an existing (2^m)−1 bit wide MWA code word (OLD_C) currently stored in a subset of storage cells in a semiconductor memory array and a new code word (NEW_C) to replace OLD_C, OLD_C representing an existing m-bit data word (OLD_D) and NEW_C representing a new data word (NEW_D) to be stored; and
    validity test logic coupled to the code word difference pattern generator to perform a bitwise compare operation on the OLD_C and on the DELTA_C_TRIAL to determine whether the DELTA_C_TRIAL satisfies a first condition of having no bits set at bit positions for which bits are set in the OLD_C and a second condition of decoding to a new trial code word (NEW_D_TRIAL) corresponding to the NEW_D, the validity test logic also to enable an update to the OLD_C by a DELTA_C equal to DELTA_C_TRIAL if both the first and second conditions are satisfied.

16. The semiconductor memory cell MWA encoding apparatus of claim 15, the validity test logic further comprising:
    first DELTA_C validity test logic coupled to the code word difference pattern generator to receive the DELTA_C_TRIAL, the first DELTA_C validity test logic also to receive the OLD_C and to perform a bitwise compare operation on the DELTA_C_TRIAL and the OLD_C and to request a different DELTA_C_TRIAL from the pattern generator if a bit at any bit position is set in both the DELTA_C_TRIAL and in the OLD_C.

17. The semiconductor memory cell MWA encoding apparatus of claim 16, the validity test logic further comprising:
    OR logic coupled to the first DELTA_C validity test logic to receive the DELTA_C_TRIAL, the OR logic also to receive the OLD_C and to combine the DELTA_C_TRIAL and the OLD_C via a logical OR operation to generate a trial code word NEW_C_TRIAL.

18. The semiconductor memory cell MWA encoding apparatus of claim 17, the validity test logic further comprising:
    a memory cell reset avoidance (MCRA) decoder coupled to the OR logic to receive the NEW_C_TRIAL and to decode the NEW_C_TRIAL to generate a trial new data word (NEW_D_TRIAL).

19. The semiconductor memory cell MWA encoding apparatus of claim 18, the validity test logic further comprising:
    second DELTA_C validity test logic coupled to the MCRA decoder to receive the NEW_D_TRIAL and the NEW_D, to perform a bitwise compare operation on the NEW_D_TRIAL and the NEW_D, and to request a different DELTA_C_TRIAL from the pattern generator if the NEW_D_TRIAL is not equal to the NEW_D.

20. The semiconductor memory cell MWA encoding apparatus of claim 19, the validity test logic further comprising:
    DELTA_C enable logic coupled to the second DELTA_C validity test logic to receive an indication from the second DELTA_C validity test logic when the NEW_D_TRIAL is equal to the NEW_D and to enable DELTA_C to be written to the subset of storage cells in the memory array if the NEW_D_TRIAL is equal to the NEW_D.

* * * * *